United States Patent [19]

Panis

[11] Patent Number: 5,604,751
[45] Date of Patent: Feb. 18, 1997

[54] TIME LINEARITY MEASUREMENT USING A FREQUENCY LOCKED, DUAL SEQUENCER AUTOMATIC TEST SYSTEM

[75] Inventor: Michael C. Panis, Brookline, Mass.

[73] Assignee: Teradyne, Inc., Boston, Mass.

[21] Appl. No.: 555,438

[22] Filed: Nov. 9, 1995

[51] Int. Cl.⁶ .................................................. G01R 31/28
[52] U.S. Cl. .......................................................... 371/22.1
[58] Field of Search ................................. 371/22.1, 22.2, 371/22.5, 22.6; 324/158.1

[56] References Cited

U.S. PATENT DOCUMENTS

| | | | |
|---|---|---|---|
| 4,792,932 | 12/1988 | Bowhers et al. | 368/113 |
| 5,524,114 | 6/1996 | Peng | 371/22.1 |
| 5,528,162 | 6/1996 | Sato | 371/22.1 |
| 5,544,107 | 8/1996 | Hill | 371/22.1 |

Primary Examiner—Vincent P. Canney
Attorney, Agent, or Firm—Richard E. Gamache

[57] ABSTRACT

A method for automatically testing digital electronic circuits and performing time measurements whereby a digital signal having a frequency f1 is sampled at a rate equal to f2. The sampling frequency f2 is either slightly less than or slightly greater than f1. As a result, the digital signal is sampled at either a slightly later position in time or a slightly earlier position in time during each successive period of the digital signal. After the entire interval of interest on the digital signal has been sampled, either the number of logical high data samples or the number of logical low data samples is determined. Finally, the number of data samples is multiplied by the effective time period between data samples. In this way, pulse widths on digital signals can be measured with both high resolution and good linearity. This method of time measurement may also be used to calibrate an electronic circuit tester.

7 Claims, 6 Drawing Sheets

TIME LINEARITY MEASUREMENT USING A FREQUENCY LOCKED, DUAL SEQUENCER AUTOMATIC TEST SYSTEM

BACKGROUND OF THE INVENTION

This invention relates generally to automatic test equipment, and more particularly to automatic test equipment used to make time measurements on digital electronic circuits.

Manufacturers of digital electronic circuits commonly use automatic test equipment (testers) to determine whether the circuits contain manufacturing defects. In general, a tester includes computerized control circuitry, numerous driver/receiver channels, and numerous tester pins. Each tester pin connects a driver/receiver channel to an electrical node of a circuit under test (CUT).

A tester typically provides digital test signals to and receives digital output signals from the electrical nodes of the CUT. The tester then compares the resulting output signals with values that would be expected from a properly functioning device. Both the digital test signals and the expected response values are defined by a series of test vectors. A typical test vector gives information regarding the data value, timing, and format of the digital signal that appears at each tester pin during one cycle of the tester's operation. For example, a test vector indicates whether the logical value of the digital signal is either a high or a low, the amount of time the signal is delayed relative to the beginning of the test cycle, and whether the signal is applied to or expected to be observed at a node of the CUT.

Figure 1A:
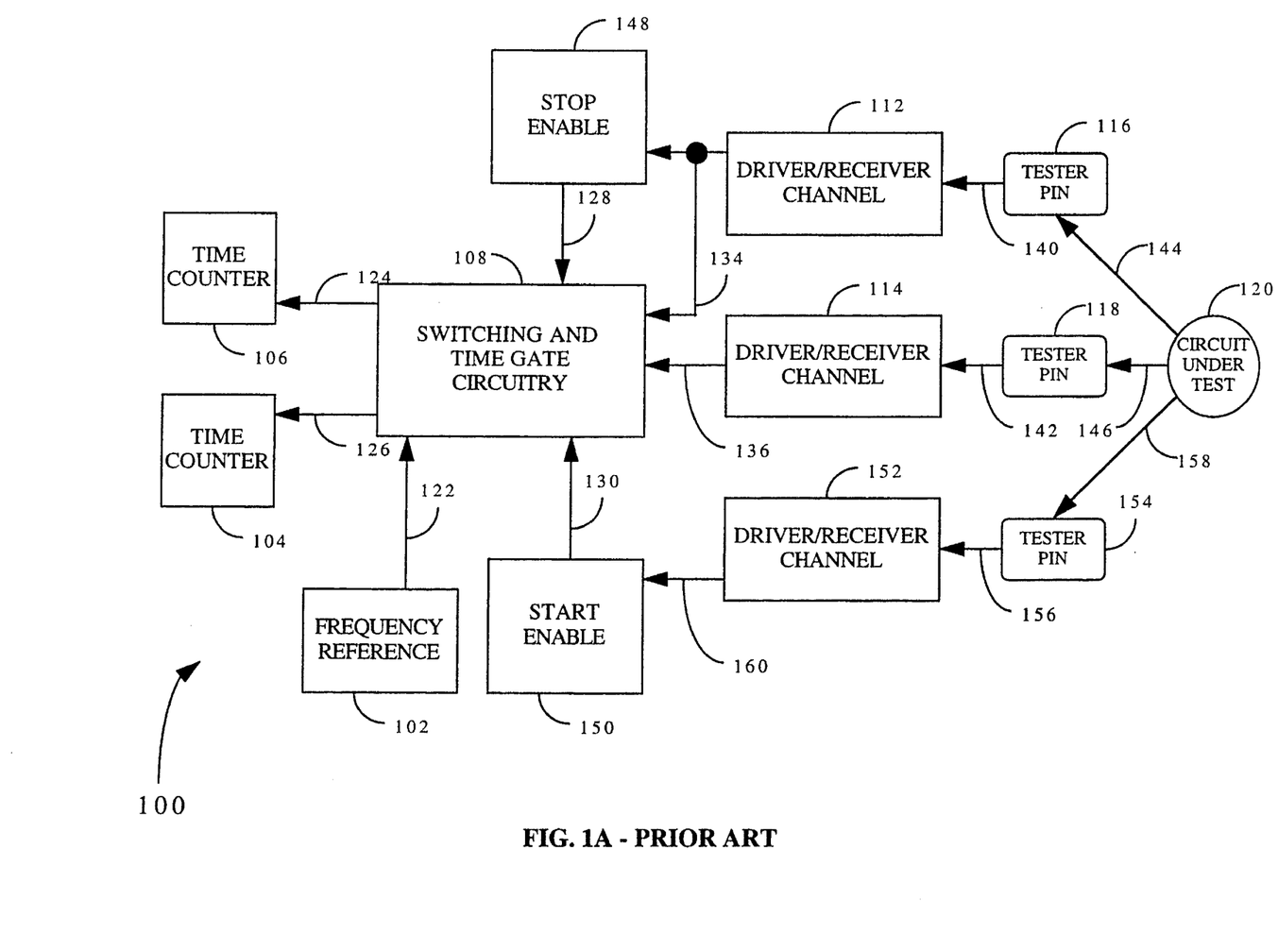
FIG. 1A is a partial block diagram of a prior art tester.

A tester also includes time measurement circuitry. FIG. 1A shows a partial block diagram of prior art tester 100, described in U.S. Pat. No. 4,792,932 to Bowhers et al. Digital comparators (not shown) included in driver/receiver channel 112 and driver/receiver channel 114 detect digital signals on CUT 120 and produce timing signals, called "start" and "stop" event edges, when the signals cross specified voltage thresholds. Driver/receiver channel 112 and driver/receiver channel 114 present the event edges to switching and time gate circuitry 108, which provides gated clock pulses and event edges to time counter 106 and time counter 104, respectively. Finally, time counter 106 counts the clock pulses between the "start" and "stop" event edges, and time counter 104 optionally counts the events between the "start" and "stop" event edges.

Figure 1B:
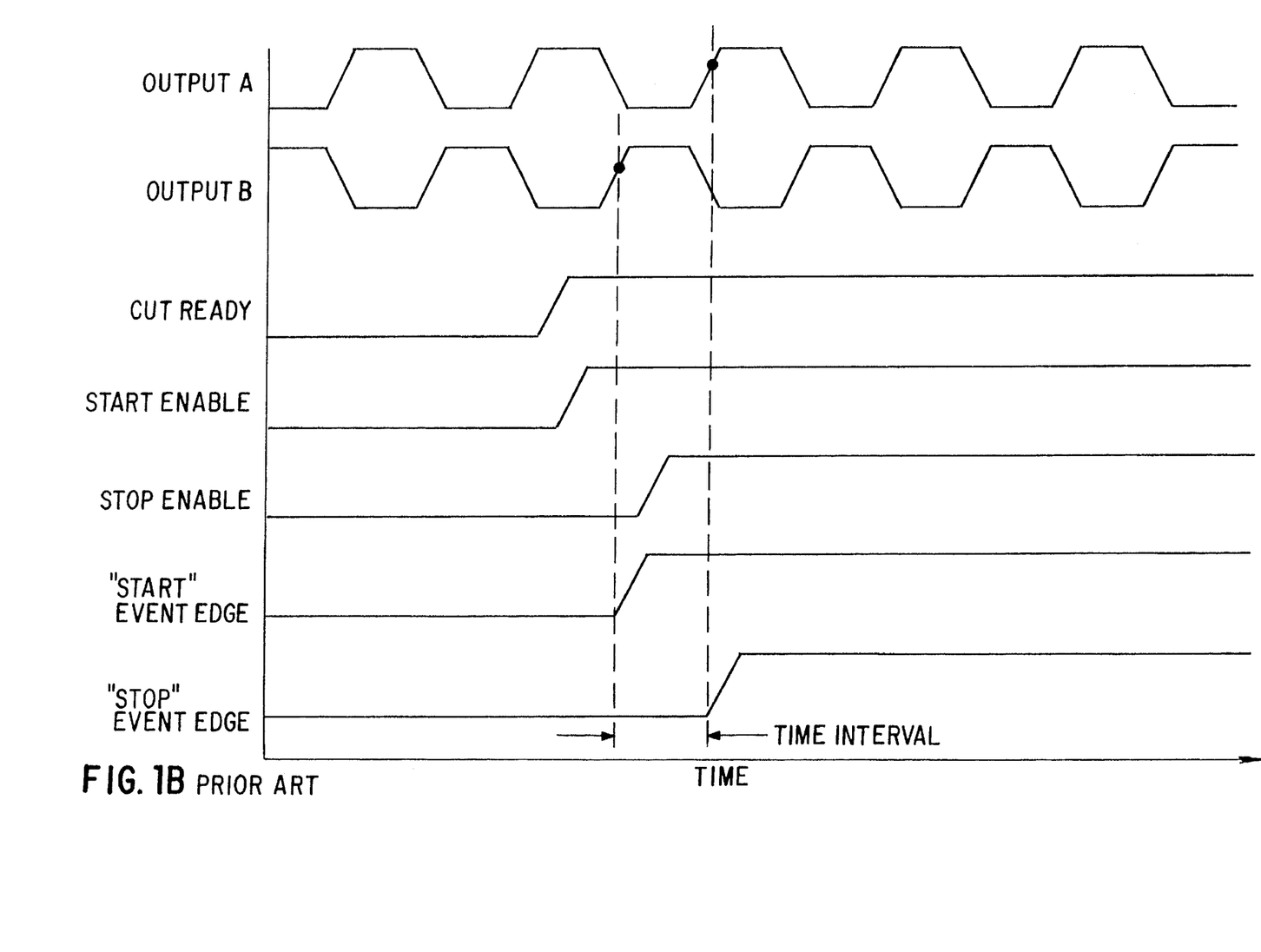
FIG. 1B is a timing diagram describing a time measurement using the FIG. 1A apparatus.

FIG. 1B is a timing diagram that is useful in describing the operation of tester 100. It is desired to measure the time interval from a rising edge of OUTPUT A to a rising edge of OUTPUT B. Both OUTPUT A and OUTPUT B are generated by CUT 120. Signal CUT READY, generated by CUT 120, is connected through tester pin 154 to a digital comparator (not shown) in driver/receiver channel 152. The digital comparator presents an edge to start enable 150 which provides signal START ENABLE to switching and time gate circuitry 108. Signal OUTPUT B is connected through tester pin 116 to a digital comparator (not shown) in driver/receiver channel 112. Driver/receiver channel 112 presents signal "START" EVENT EDGE to both stop enable 148 and switching and time gate circuitry 108. Stop enable 148 then provides signal STOP ENABLE to switching and time gate circuitry 108. Similarly, signal OUTPUT A is connected through tester pin 118 to a digital comparator (not shown) in driver/receiver channel 114, which presents signal "STOP" EVENT EDGE to switching and time gate circuitry 108. Switching and time gate circuitry 108 provides clock signals to time counter 106 during the time between signal "START" EVENT EDGE and signal "STOP" EVENT EDGE. The clock pulses counted between these two events are used to determine the desired time interval.

Such an approach is useful in making time measurements on digital signals. Moreover, this approach eliminates the need to route the output signals from CUT 120 to tester 100. The output signals pass to the driver/receiver channels, which are generally located near CUT 120, and only the "start" and "stop" event edges are routed to the time measurement circuitry in tester 100. However, this approach to making time measurements is limited by the resolution of the clock pulses provided by switching and time gate circuitry 108 to the time counters. For example, in order to make accurate time measurements, the clock pulses must have a period that is substantially less than the required resolution of the time measurement.

Another approach uses an interpolation technique to improve the accuracy of time measurements. For example, instead of simply counting the number of clock pulses occurring between the "start" event edge and the "stop" event edge, the time interval from the "start" event edge to the first clock pulse may also be measured. The "start" event edge triggers a ramp generator which produces an output voltage that increases linearly at a predetermined rate from a specified reference voltage. The first clock pulse then triggers circuitry which samples the output voltage of the ramp generator. The magnitude of the output voltage of the ramp generator is directly proportional to the time interval from the "start" event edge to the first clock pulse. This time interval is then added to the time interval determined by counting clock pulses between the "start" event edge and the "stop" event edge to achieve better accuracy in time measurements.

However, the accuracy of time measurements made using the interpolation technique is limited because it is usually impossible to make the output voltage of the ramp generator linear over its full range. For example, the reference voltage and the voltage at which the output is sampled may not represent two points within the linear region of the ramp. As a result, the output voltage of the ramp generator may not in fact be directly proportional to the time interval of interest.

Still another approach to making time measurements converts an output signal from the CUT to a DC value. The conversion is performed by a low-pass filter using known DC transform techniques. The resulting DC output, which is proportional to the duty cycle of the periodic output pulse provided by the CUT, is then sampled and measured. However, the resulting DC signal is often noisy, and the conversion is generally not accurate over a wide range of output pulse widths. Further, the circuitry which samples and measures the DC output must be linear over a wide range of voltage values.

Although each of these techniques have been used to make time measurements on digital electronic circuits, it would be desirable to have a method of making time measurements that provides both high resolution and good linearity without requiring a significant amount of additional circuitry in a tester.

SUMMARY OF THE INVENTION

With the foregoing background in mind, it is an object of the invention to provide a tester that makes accurate time measurements on signals generated by digital electronic circuits.

Another object of the invention is to provide a tester that makes time measurements with both high resolution and good linearity.

Still another object of the invention is to provide a tester that makes accurate time measurements for the purpose of internal calibration.

The foregoing and other objects are achieved by sampling a periodic output signal, which has a frequency equal to f1, at a node of a digital electronic circuit. The output signal is sampled at a rate equal to f2, where f2 is either slightly less than or slightly greater than f1. As a result, the output signal is sampled at either a slightly later position in time or a slightly earlier position in time during each successive period of the output signal. Next, the logical values of the sampled data are determined, and the number of high data samples are counted. Finally, the number of high data samples is multiplied by $|(1/f2)-(1/f1)|$, which is the effective time period between data samples. Consequently, pulse widths on digital output signals generated by a digital electronic circuit can be determined with a high degree of accuracy.

In one embodiment, the tester generates a digital signal, with a frequency equal to f1, at a first driver/receiver channel. The digital signal includes a periodic pulse with a nominal pulse width. The signal is sampled by a second driver/receiver channel within the tester at a rate equal to f2, where f2 is either slightly less than or slightly greater than f1. After the entire pulse has been sampled, the logical values of the sampled data are determined, and the number of high data samples is counted. Next, the number of high data samples is multiplied by $|(1/f2)-(1/f1)|$ to determine the pulse width measurement. The nominal pulse width is then compared with the measured pulse width. Finally, the first channel circuitry is adjusted if the measured pulse width is not equal to the nominal pulse width. This method may be used to calibrate a tester.

Still further objects and advantages will become apparent from a consideration of the ensuing description and drawings.

BRIEF DESCRIPTION OF THE DRAWINGS

The invention will be better understood by reference to the following more detailed description and accompanying drawings in which.

DESCRIPTION OF THE PREFERRED EMBODIMENT

In the following description, a bus having multiple signal lines is indicated by a line with a slash through it, and a single signal line is indicated by a line without a slash. Furthermore, signals are indicated in all capital letters.

Figure 2A:
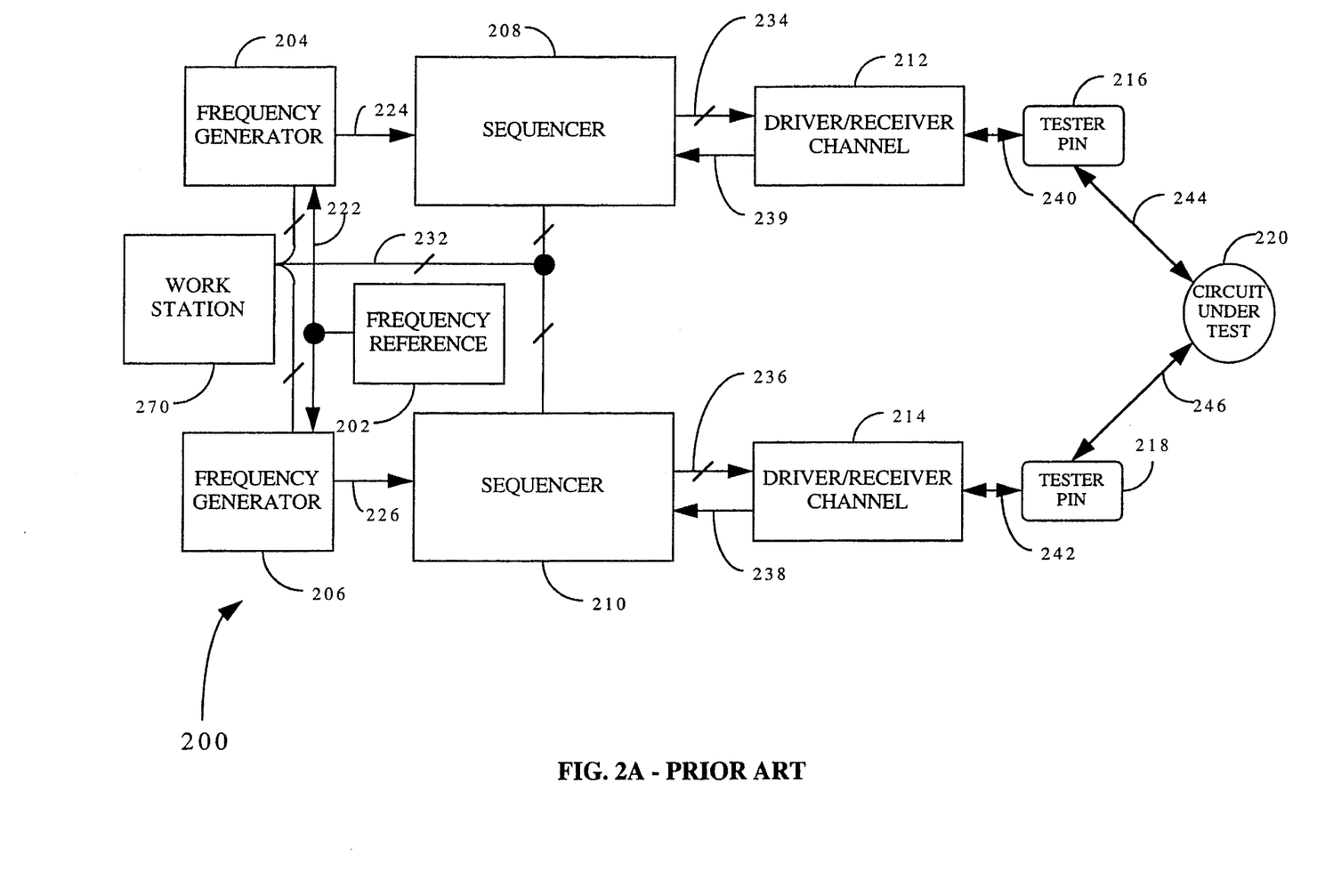
FIG. 2A is a partial block diagram of a prior art tester which makes time measurements using the method of the present invention.

FIG. 2A shows a functional block diagram of tester 200 configured to perform time measurements in accordance with the present invention. The circuitry for tester 200 is normally enclosed in a tester body (not shown), comprised of an electronics cabinet and a test head. Interface hardware (not shown) such as a device interface board (DIB), probe interface board (PIB), or handler interface board (HIB), separates the tester body from CUT 220. The interface hardware includes numerous tester pins such as tester pin 216 and tester pin 218.

Typically, computer work station 270 controls tester 200. A test engineer develops test programs, each comprised of a series of test vectors, on work station 270. The test engineer then loads the test programs into the respective memories (not shown) of sequencer 208 and sequencer 210 over system bus 232. The test engineer also enters commands for tester 200 at work station 270; for example, the test engineer may enter a command either to start a test or to specify certain operating parameters. Finally, tester 200 sends test results over system bus 232 to work station 270 which displays the results to the test engineer.

Tester 200 typically makes numerous connections to CUT 220. For the embodiment described herein, CUT 220 is a digital electronic circuit, and tester pin 216 and tester pin 218 are connected to different electrical nodes of CUT 220. Driver/receiver channel 212 generates test signals and applies them to CUT 220 through tester pin 216. In addition, driver/receiver channel 214 detects output signals from a node of CUT 220 through tester pin 218. The test program executed by tester 200 specifies the characteristics of both the test signals applied to CUT 220 and the output signals tester 200 expects to receive from CUT 220.

For the preferred embodiment described herein, sequencer 208 is coupled to frequency generator 204, and sequencer 210 is coupled to frequency generator 206. By sending commands to frequency generator 204 and frequency generator 206 from work station 270, the test engineer can specify the frequencies of the clock signals generated by frequency generator 204 and frequency generator 206. As a result, the test engineer can program tester 200 so that sequencer 208 and sequencer 210 operate according to different test cycle times.

Both frequency generator 204 and frequency generator 206 are coupled to frequency reference 202. Consequently, the clock signals produced by frequency generator 204 and frequency generator 206 are synchronized with frequency reference 202. This gives the test engineer the advantage of being able to control accurately the relative test cycle times of sequencer 208 and sequencer 210.

For each test cycle, sequencer 208 and sequencer 210 read a test vector from their memories (not shown), and send the data value, timing information, and format information contained in the test vector to driver/receiver channel 212 and driver/receiver channel 214, respectively. The data value indicates whether the logical value of the test signal or output signal is either a high or a low. The timing information specifies the amount of time the signal is delayed relative to the beginning of the test cycle. Finally, the format information indicates whether the signal is applied to or expected to be observed at a node of CUT 220. The data value, timing information, and format information are all in digital form.

Driver/receiver channel 212 applies a test signal to a node of CUT 220 through tester pin 216 in accordance with the data value, timing information, and format information specified by the test vectors stored in the memory of sequencer 208. Similarly, driver/receiver channel 214 observes an output signal at a node of CUT 220 through tester pin 218 in accordance with the test vectors stored in the memory of sequencer 210. For the embodiment described herein, driver/receiver channel 214 samples the output signal, and then sends information regarding the sampled data to sequencer 210 through line 238 for further processing.

Figure 2B:
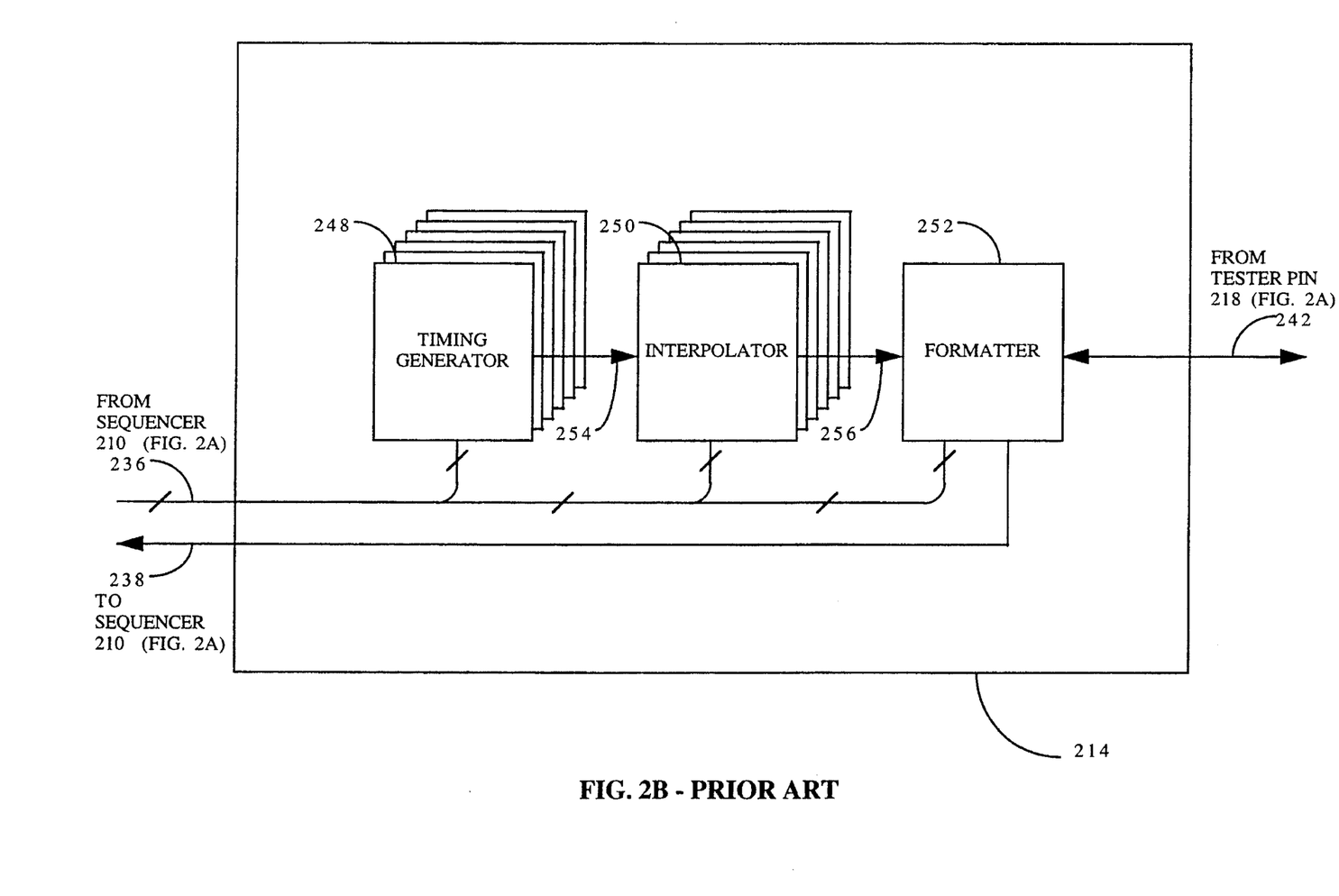
FIG. 2B is a block diagram of the driver/receiver channel used with FIG. 2A.

FIG. 2B shows a functional block diagram of driver/receiver channel 214. The hardware of driver/receiver channel 212 is identical to that of driver/receiver channel 214. However, for this embodiment, formatter 252 of driver/receiver channel 214 receives an output signal from CUT 220, whereas the corresponding formatter of driver/receiver channel 212 applies a test signal to CUT 220. Further, formatter 252 of driver/receiver channel 214 sends information regarding the sampled data to sequencer 210, whereas the corresponding formatter of driver/receiver channel 212 does not send any information to sequencer 208.

For each test cycle, sequencer 208 and sequencer 210 read a test vector from their memories, and send the data value, timing information, and format information contained in the test vector to driver/receiver channel 212 and driver/receiver channel 214, respectively.

Whereas the data value information sent to driver/receiver channel 212 represents the logical value of the test signal that should be provided to CUT 220, the data value information sent to driver/receiver channel 214 represents the logical value of the output signal which driver/receiver channel 214 expects to observe from CUT 220. Moreover, whereas the format information sent to driver/receiver channel 212 indicates that the test signal should be applied to a node of CUT 220, the format information sent to driver/receiver channel 214 indicates that the output signal should be observed at a node of CUT 220.

Not all signals should be applied to or observed at a node of CUT 220 exactly at the beginning of a test cycle. In practice, different operations occur at different times relative to the start of a cycle. Accordingly, the timing information sent to driver/receiver channel 212 and driver/receiver channel 214 indicates the amount of time a signal (or an "edge") is delayed relative to the beginning of the test cycle.

Turning once again to FIG. 2B, we see that sequencer 210 sends data value, timing information, and format information to timing generator 248 on bus 236. Both driver/receiver channel 212 and driver/receiver channel 214 contain six copies of timing generator 248. Sequencer 210 internally generates a beginning of test cycle (BOC) signal (not shown) based upon the clock signal provided by frequency generator 206. Similarly, sequencer 208 internally generates a BOC signal based upon the clock signal provided by frequency generator 204.

The respective circuitry of sequencer 208 and sequencer 210 does not provide the resolution required to generate a BOC signal exactly at the beginning of a test cycle. As a result, sequencer 208 and sequencer 210 also provide "residue" values (not shown) which are in digital form and indicate the time difference between the BOC pulse and the time which should be the start of a test cycle. Referring to FIG. 2B, sequencer 210 sends both the high order bits and the low order bits of the residue value to driver/receiver channel 214 over bus 236. The high order bits are sent to timing generator 248, and the low order bits are sent to interpolator 250.

In addition, timing generator 248 stores a delay which is unique to each edge generated by each channel. This delay compensates for the different propagation length of each channel. This value is called a "deskew" value (not shown), and it is also in digital form.

Timing generator 248 then combines the residue value, the deskew value, and the timing information to produce signal EDGE COARSE on line 254. EDGE COARSE indicates the amount of time an edge signal should be delayed relative to the BOC signal.

Interpolator 250 is coupled to EDGE COARSE on line 254. Both driver/receiver channel 212 and driver/receiver channel 214 contain six copies of interpolator 250. Interpolator 250 receives the low order bits of the residue value on line 236. Interpolator 250 includes an analog comparator (not shown) which uses the lower order bits of the residue value and an internally generated ramp signal (not shown) to produce a fine delay value (not shown). Interpolator 250 then combines the fine delay value and EDGE COARSE to produce FINAL DELAY on line 256. FINAL DELAY indicates the precise amount of time an edge signal should be delayed relative to the BOC signal.

It should be noted that it is generally impossible to make the internally generated ramp signal of interpolator 250 linear over its entire range of output. Further, as interpolator 250 is called upon to provide finer resolution, linearity generally worsens. A primary advantage of the present invention is that the inherent non-linearities of interpolator 250 do not affect the accuracy of time measurements. This is because the present invention does not rely upon interpolator 250 to achieve time measurements with fine resolution. The present invention produces time measurements with both fine resolution and good linearity using the difference between the test cycle times defined by frequency generator 204 and frequency generator 206.

Formatter 252 is connected to FINAL DELAY on line 256. Formatter 252 receives the data value and format information from sequencer 210 on line 236. Formatter 252 contains the drivers and sampling circuitry needed to perform the required I/O operations. Using the FINAL DELAY value, the format information, and the data value, formatter 252 samples a signal on line 242 at precisely the time specified by the test engineer in the test program. Similarly, the formatter of driver/receiver channel 212 generates a test signal at precisely the time specified by the test program, and sends the test signal to a node of CUT 220.

Formatter 252 includes a fail processor (not shown) which compares the sampled data to the expected response values defined by the data value and format information. For the embodiment described herein, the expected response values are all logical low. As a result, the fail processor will regard all sampled data with logical high values as "failures." The fail processor then sends the failure information to sequencer 210 via line 238. The failure information is in digital form, and indicates whether the data sample corresponding to a particular test cycle is a failure.

Figure 2C:
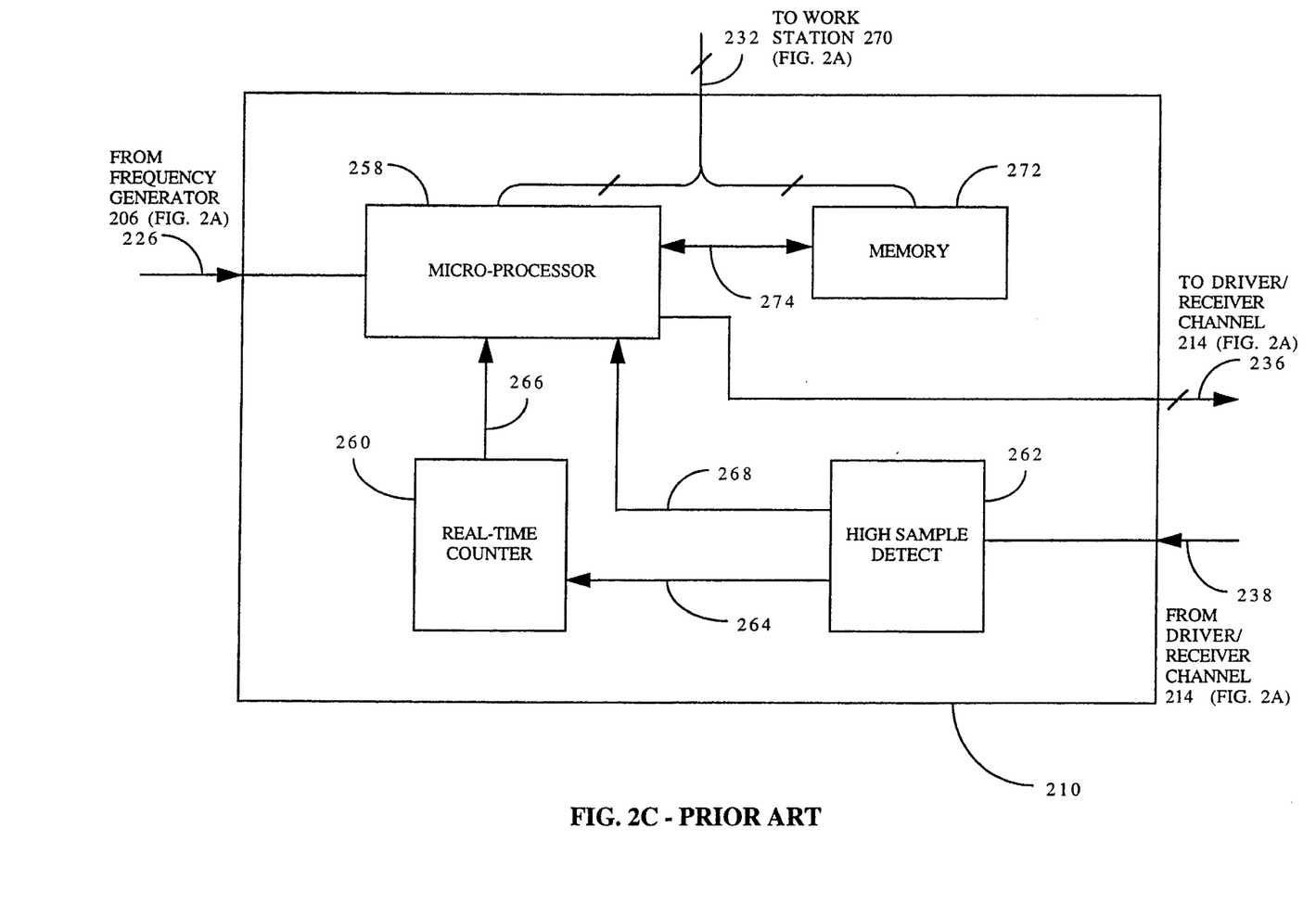
FIG. 2C is a block diagram of the sequencer used with FIG. 2A.

Turning now to FIG. 2C, the operation of sequencer 210 is described in greater detail. The hardware of sequencer 208 is identical to that of sequencer 210. Sequencer 210 is coupled to signal DATA on line 238 so that high sample detect 262 and real-time counter 260 can process the failure information provided by driver/receiver channel 214.

At power-up, micro-processor 258 is held reset while work station 270 loads the test program into memory 272 through system bus 232. Once the test program is loaded, micro-processor 258 re-gains control and begins execution of the test program. During the process of executing a test program, micro-processor 258 reads test vectors from memory 272 and sends the corresponding data value, timing information, and format information to driver/receiver channel 214 over line 236.

Micro-processor 258 is coupled to frequency generator 206 via line 226. By sending commands to frequency generator 206 through work station 270, the test engineer can specify the frequency of the clock signal generated by frequency generator 206. Similarly, the test engineer can program the frequency of the clock signal generated by frequency generator 204. This gives the test engineer the advantage of being able to configure sequencer 208 and sequencer 210 so that they operate according to different test cycle times.

High sample detect 262 receives failure information from driver/receiver channel 214 on line 238. High sample detect 262 is also coupled to both micro-processor 258 and real-time counter 260. High sample detect 262 sends a clock pulse to real-time counter 260 if the failure information indicates that a data sample is a failure; i.e., the data sample has a logical high value. Further, if the failure information indicates that a data sample is a failure, then the LEVEL signal on line 268 goes high.

Micro-processor 258 is connected to signal COUNT RESULTS on line 266 so that it may read the total number of data samples with logical high values counted by real-time counter 260. Micro-processor 258 also reads the logical value of the last sample processed by high sample detect 262 on line 268. As a result, micro-processor 258 can determine the number of "high" data samples taken from the output signal generated by CUT 220.

System bus 232, sequencer 208, sequencer 210, frequency generator 204, frequency generator 206, driver/receiver channel 212, driver/receiver channel 214, timing generator 248, interpolator 250, and formatter 252 represent components which are conventionally included in a tester. Accordingly, they are of known construction. The specific implementation of the known components is not critical to the invention.

Time measurements may be made while tester 200 executes a test program. Commands from work station 270 specify the frequencies of the clock signals provided by frequency generator 204 and frequency generator 206.

Typically, low cost technologies, such as CMOS, are used in frequency reference 202, frequency generator 204, and frequency generator 206. The most widely used CMOS circuitry has a maximum operating frequency of approximately 100 MHz. As a result, the clock signals provided by the frequency generators have a resolution of only 10 nsecs. Accordingly, the test cycle times specified for sequencer 208 and sequencer 210 must be at least 10 nsecs. However, testers are required to perform time measurements on signals that have a resolution on the order of 250 psecs. An important advantage of the present invention is that it enables a tester to perform accurate time measurements even though the period of the clock signals produced by frequency generator 204 and frequency generator 206 is greater than the required resolution of the time measurement.

Figure 2D:
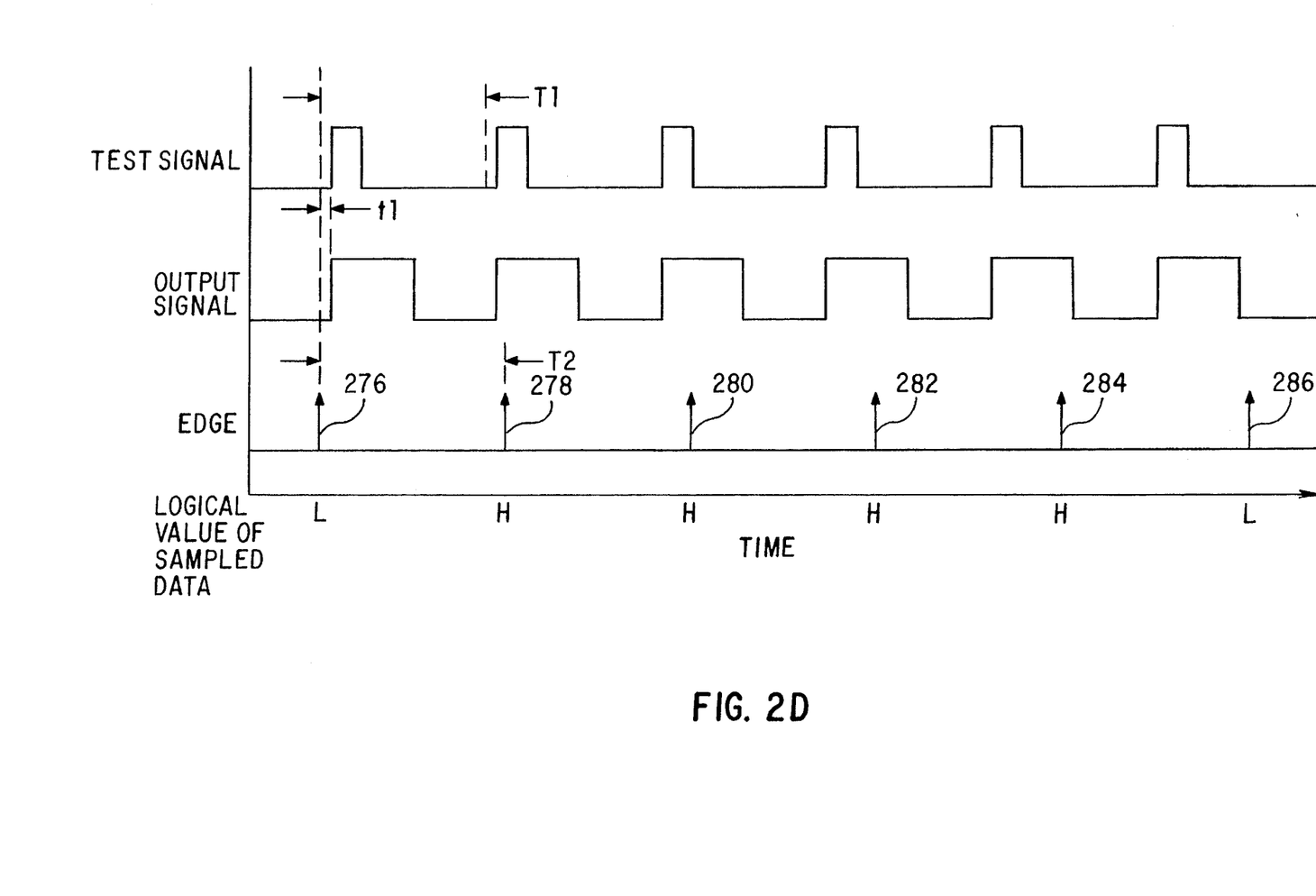
FIG. 2D is a timing diagram describing a time measurement using the FIG. 2A apparatus.

FIG. 2D shows a timing diagram of signals which might be generated by tester 200. It is assumed that CUT 220 produces a periodic pulse of unknown duration in response to a test signal generated by tester 200. T1 represents the programmed test cycle time for sequencer 208, and T2 represents the programmed test cycle time for sequencer 210. TEST SIGNAL represents the test signal generated by driver/receiver channel 212, OUTPUT SIGNAL represents the periodic pulse generated by CUT 220, and EDGE represents the time when driver/receiver channel 214 samples OUTPUT SIGNAL. For the example shown in FIG. 2D, the period of both TEST SIGNAL and OUTPUT SIGNAL is T1, and the period of signal EDGE is T2.

In order to implement the time measurement method utilized by the present invention, the test engineer must specify T1 and T2 such that T2 is either slightly longer than or slightly shorter than T1. For example, the test engineer may program the frequency of the clock signal provided by frequency generator 204 as 50.000001 MHz. The test engineer may also program the frequency of the clock signal provided by frequency generator 206 as 50.0 MHz. Consequently, T1 would be equal to approximately 19.9999996 nsecs, and T2 would be equal to 20.0 nsecs. However, the time difference |T2−T1| would be equal to approximately 0.4 fsecs. Even though the clock generation circuitry of tester 200 produces clock signals with periods greater than or equal to 10 nsecs, the method of the present invention can perform time measurements with a resolution on the order of 1 fsec.

An example of how the present invention can be used to measure the pulse width of an output signal generated by CUT 220 will be provided with reference to FIG. 2D. The test engineer enters commands at work station 270 to specify the magnitudes of test cycle T1 and test cycle T2. In order to achieve a high level of accuracy, the test engineer specifies the frequency of frequency generator 204 as 50.000001 MHz, and the frequency of frequency generator 206 as 50.0 MHz. As a result, |T2−T1| equals 0.4 fsecs.

Next, the test engineer specifies the characteristics of the test signal generated by driver/receiver channel 212. As shown in FIG. 2D, TEST SIGNAL is defined such that CUT 220 produces OUTPUT SIGNAL, which consists of a single pulse that occurs periodically t1 seconds after the start of test cycle T1. The test engineer then specifies the characteristics of signal EDGE, which is produced by driver/receiver channel 214. Signal EDGE consists of a single pulse that occurs periodically at the start of test cycle T2, and represents the times when tester 200 samples OUTPUT SIGNAL.

Sequencer 208 and sequencer 210 communicate directly with each other over system bus 232. For example, sequencer 210 can direct sequencer 208 to inhibit the occurrence of TEST SIGNAL until sequencer 210 instructs driver/receiver channel 214 to begin producing EDGE. Further, sequencer 208 can direct sequencer 210 to inhibit the occurrence of EDGE after sequencer 208 instructs driver/receiver channel 212 to stop producing TEST SIGNAL. In this way, the test engineer can ensure that tester 200 will sample the entire pulse of interest, and that tester 200 will stop sampling after it has collected a sufficient number of data samples to measure pulse width.

As shown in FIG. 2D, EDGE causes tester 200 to sample OUTPUT SIGNAL every T2 seconds. Since T2 is greater than T1 in this example, tester 200 samples OUTPUT SIGNAL at a slightly later position in time for each successive sample. In effect, tester 200 scans across OUTPUT SIGNAL in graduations of time equal to the effective time period between samples; i.e., |T2−T1| or 0.4 fsecs. Instead of trying to sample the entire pulse of interest during one cycle of T1, tester 200 achieves greater resolution by sampling the pulse of interest over successive T1 cycles.

It should be noted that there is a limit to the range of values that may be specified for T2 relative to T1. In the preferred embodiment, T2 satisfies the mathematical relationship, $(0.5)T1 \leq T2 \leq (1.5)T1$, with the exception that T2 does not equal T1. Accordingly, frequency f2 satisfies the mathematical relationship, $(\frac{2}{3})f1 \leq f2 \leq (2)f1$, with the exception that f2 does not equal f1.

If T2 were equal to T1, then OUTPUT SIGNAL would be sampled at the same point in time during each T1 cycle, thereby making meaningful time measurements impossible. If T2 were equal to either (0.5)T1 or (1.5)T1, then only two samples would be taken of OUTPUT SIGNAL, over two successive T1 cycles. In the preferred embodiment, T1 and T2 are specified so that the difference |T2–T1| is as small as possible. As a result, tester 200 performs time measurements with the best possible accuracy.

The test engineer also specifies the format information such that the fail processor (not shown) included in formatter 252 will regard all sampled data with logical high values as "failures." Driver/receiver channel 214 then sends the failure information to high sample detect 262 on line 238. High sample detect 262 sends a clock pulse to real-time counter 260 on line 264 if the failure information indicates that a data sample is a failure; i.e., the data sample has a logical high value. Further, if the failure information indicates that a data sample is a failure, then the LEVEL signal on line 268 goes high. Otherwise, LEVEL remains logical low. In this way, tester 200 can maintain a running tally of the number of "high" data samples. In addition, the ability of real-time counter 260 to determine quickly the number of high data samples constitutes an advantage of the present invention.

As driver/receiver channel 214 begins sampling OUTPUT SIGNAL, the logical values of the sampled data will alternate fairly regularly between "high" and "low" as EDGE scans across the rising edge of the pulse of interest. Similarly, the logical values of the sampled data will alternate fairly regularly between "high" and "low" as EDGE scans across the falling edge of the pulse of interest. In fact, when EDGE is coincident with the rising and falling edges of the pulse of interest, roughly half of the sampled data will result in failures.

After EDGE scans across the rising edge of the pulse of interest, tester 200 will observe a series of high data samples. Using the information derived from COUNT RESULTS on line 266 and LEVEL on line 268, micro-processor 258 can determine the number of samples in the series of observed high data samples. Finally, EDGE scans across the falling edge of the pulse of interest.

According to the time measurement depicted in FIG. 2D, sample 276 is a logical low, sample 278 through sample 284 are logical high, and sample 286 is a logical low. Accordingly, high sample detect 262 processed a series of four high data samples. As a result, micro-processor 258 calculated the width of the pulse defined by OUTPUT SIGNAL by multiplying the effective time period between samples by four. If the effective time period between samples, |T2–T1|, were 0.4 fsecs, then the measured pulse width would be 1.6 fsecs +/–0.4 fsecs. Although the resolution of frequency reference 202, frequency generator 204, and frequency generator 206 is only 10 nsecs, tester 200 is able to measure pulse width to within 0.4 fsecs. This constitutes a substantial advantage over the time measurement schemes currently used by testers.

Having described one embodiment of the invention, it will be apparent to one of skill in the art that various alternative embodiments could be formed. First, it should be noted that one of skill in the art could design a circuit with different clock frequencies or with signals having different numbers of bits.

Also, the above description explained how tester 200 could be used to measure the width of a pulse on an output signal generated by CUT 220. The test engineer could also configure a test program so that data samples are taken over an entire cycle of T1. As a result, tester 220 could measure the duty cycle characteristics of a test signal during a complete test cycle.

Further, one of skill in the art could develop test programs to measure other time characteristics of digital signals. For example, by incorporating a set/reset latch in tester 200, a test engineer could measure the time interval between two periodic pulses generated by CUT 220. The rising edge of one pulse could be used to set the latch, and the rising edge of the other pulse could be used to reset the latch. The method of the present invention could then be used to determine the time interval between the edges of the two pulses.

The test engineer could also determine either the rise time or the fall time of an edge of a periodic pulse by configuring two driver/receiver channels so that they respond to different voltage thresholds. Next, the same pulse produced by CUT 220 could be routed to both driver/receiver channels. When an edge of the pulse crosses one specified voltage threshold, the corresponding driver/receiver channel could produce a signal to set a set/reset latch. Similarly, when the same edge crosses the other specified voltage threshold, the corresponding driver/receiver channel could produce a signal to reset the latch. The method of the present invention could then be used to determine the rise time or the fall time of the edge.

Moreover, it was described that interpolator 250 includes circuitry with inherent non-linearities. As a result, interpolator 250 must be periodically calibrated to ensure accurate tester results. Since the present invention does not rely upon the nonlinear analog circuitry contained in the interpolators to make time measurements, it may be used to calibrate the interpolators without introducing additional non-linearity error.

In order to calibrate interpolator 250, the test engineer could direct one of the six timing generators in driver/receiver channel 214 to produce a reference edge, and direct another timing generator to produce a second edge slightly later in time. The second edge would be specified such that interpolator 250 is required to add a fine delay. Both edges would then be routed to formatter 252 which produces a pulse whose width is defined by the edges. The method of the present invention would then be used to measure the pulse width. The test engineer would adjust the circuitry of interpolator 250 so that the measured pulse width equals the specified time interval between the two edges. Using this method of calibration, the test engineer would be able to reduce significantly the amount of test system error in tester 200.

Therefore, the invention should be limited only by the spirit and scope of the appended claims.

What is claimed is:

1. A method of operating automatic test equipment to make time measurements on digital electronic circuits, used to determine whether a digital semiconductor chip is functioning properly, comprising:

(a) measuring the frequency, f1, of an output signal at a node of the digital electronic circuit;

(b) repetitively sampling said output signal at a predetermined frequency f2 to produce sampled data;

(c) determining the number of logical high data samples; and (d) multiplying the number of high data samples by $|(1/f2)-(1/f1)|$, whereby $|(1/f2)-(1/f1)|$ is the effective time period between data samples.

2. The method as recited in claim 1, wherein frequency f2 satisfies the mathematical relationship $(\frac{2}{3})f1 \leq f2 \leq 2f1$, with the exception that f2 does not equal f1.

3. The method as recited in claim 1, wherein said determining in step (c) comprises determining the number of logical low data samples, and said multiplying in step (d) comprises multiplying the number of low data samples by $|(1/f2)-(1/f1)|$.

4. A method of calibrating the channel circuitry of automatic test equipment to minimize test system error, comprising:

(a) generating a test pulse having a predetermined frequency f1 and a programmed pulse width at a first channel;

(b) repetitively sampling said test pulse at a predetermined frequency f2 at a second channel to produce sampled data;

(c) determining the number of logical high data samples;

(d) multiplying the number of high data samples by $|(1/f2)-(1/f1)|$ to determine a measured pulse width, whereby $|(1/f2)-(1/1)|$ is the effective time period between data samples;

(e) comparing said measured pulse width with said programmed pulse width; and (f) adjusting said first channel circuitry if said measured pulse width is not equal to said programmed pulse width.

5. The method as recited in claim 4, wherein frequency f2 satisfies the mathematical relationship $(\frac{2}{3})f1 \leq f2 \leq 2f1$, with the exception that f2 does not equal f1.

6. The method as recited in claim 4, wherein said determining in step (c) comprises determining the number of logical low data samples, and said multiplying in step (d) comprises multiplying the number of low data samples by $|(1/f2)-(1/f1)|$.

7. The method as recited in claim 4, further comprising the step of (g) repeating steps (b) through (f) until the measured pulse width equals the programmed pulse width.

* * * * *